United States Patent [19]

Youmans

[11] 3,761,782

[45] Sept. 25, 1973

[54] SEMICONDUCTOR STRUCTURE, ASSEMBLY AND METHOD

[75] Inventor: Albert P. Youmans, Cupertino, Calif.

[73] Assignee: Signetics Corporation, Sunnyvale, Calif.

[22] Filed: May 19, 1971

[21] Appl. No.: 145,039

Related U.S. Application Data

[63] Continuation of Ser. No. 796,142, Feb. 3, 1969, abandoned.

[52] U.S. Cl. ....... 317/234 R, 317/234 J, 317/234 N, 317/234 L, 317/101 A, 29/589

[51] Int. Cl. ............ H01l 3/00, H01l 5/00

[58] Field of Search ............ 317/234, 4, 5, 5.4, 317/101, 5.3; 29/589

[56] References Cited

UNITED STATES PATENTS

| | | | |
|---|---|---|---|
| 3,202,888 | 8/1965 | Evander et al. | 317/234 |
| 3,323,198 | 6/1967 | Shortes | 317/234 N |
| 3,343,256 | 9/1967 | Smith et al. | 317/235 N |
| 3,423,651 | 1/1969 | Legat et al. | 317/235 |
| 3,426,252 | 2/1969 | Lepselter | 317/234 |
| 3,462,650 | 8/1969 | Hennings et al. | 317/101 |
| 3,517,278 | 6/1970 | Hager | 317/234 |

*Primary Examiner*—John W. Huckert
*Assistant Examiner*—Andrew J. James
*Attorney*—Flehr, Hohbach, Test, Albritton & Herbert

[57] ABSTRACT

The semiconductor structure consists of a semiconductor body having first and second major surfaces with the devices being formed in one surface and with the lead structure making contact to the devices being carried by the one surface. Contact is made to the devices solely from the second major surface or back side of the semiconductor body by conducting means extending through the body and making contact with the lead structure. In the assembly, the semiconductor body is mounted upon a substrate having a surface which carries a lead structure and means is provided for connecting the conducting means extending through the semiconductor body to the lead structure carried by the substrate. The method is one which is utilized for making the structure and assembly and principally consists of the steps required for making the holes in the semiconductor body through which the conducting means can extend to the lead structure carried by the first major surface of the semiconductor body and the steps which are required for connecting the conducting means to the lead structure carried by the substrate.

7 Claims, 11 Drawing Figures

SEMICONDUCTOR STRUCTURE, ASSEMBLY AND METHOD

CROSS REFERENCE TO RELATED APPLICATION

This application is a continuation of application Ser. No. 796,142, filed on Feb. 3, 1969 and now abandoned.

BACKGROUND OF THE INVENTION

In the past, integrated circuits have been formed in semiconductor bodies and have been provided with a lead structure. These have been bonded to substrates carrying a lead structure with techniques which are typically called face bonding or flip-chip bonding. In general, such techniques have utilized some form of raised contacts in the form of pillars or balls between the lead structure carried by the semiconductor body and the lead structure carried by the substrate. Bonding systems of this type have a disadvantage in that the semiconductor body must be turned face down or flipped which makes it difficult and generally impossible to see the circuit after bonding has occurred. In addition, it is difficult to apply any type of protective coating on the surface of the semiconductor body after it has been bonded. There is, therefore, a need for a semiconductor structure, assembly and method which will overcome the above named disadvantages.

SUMMARY OF THE INVENTION AND OBJECTS

The semiconductor structure consists of a semiconductor body and has first and second major parallel surfaces. At least one device is formed in the body and has areas extending to the first major surface. A lead structure is carried by the first major surface and has contact portions which make contact with said areas of said device. The lead structure also has portions thereof which are spaced from the device. The body is provided with holes therein which extend between the first and second major surfaces and open underneath the portions of the lead structure. Conducting means is carried by the body and extends into said holes and makes contact with said portions of the lead structure whereby the conducting means provides the sole means for making contact to the device. In the semiconductor assembly, a substrate having a lead structure is provided and means is provided which establishes contact between the conducting means carried by the semiconductor body and the lead structure carried by the substrate. In the method, holes are etched into the semiconductor body, and thereafter the conducting means is formed on the body which extends through the holes and makes contact with the lead portions from the back side.

In general, it is an object of the present invention to provide a semiconductor structure, assembly and method in which contact is made to the semiconductor device in the semiconductor structure solely from the back side so that the semiconductor devices can be viewed after the semiconductor body has been bonded to a substrate.

Another object of the invention is to provide a semiconductor structure, assembly and method of the above character which readily permits placement of a protective coating over the semiconductor devices.

Another object of the invention is to provide a semiconductor structure, assembly and method of the above character in which it is unnecessary for the leads to extend through the protective coating.

Another object of the invention is to provide a semiconductor structure, assembly and method of the above character which can be utilized with epitaxial type devices and triple diffused devices.

Another object of the invention is to provide a semiconductor structure, assembly and method of the above character in which bonding to the substrate can be accomplished in a number of different ways.

Another object of the invention is to provide a semiconductor structure, assembly and method of the above character which lends itself to balls, beam leads, pillars and the like.

Additional objects and features of the invention will appear from the following description in which the preferred embodiments are set forth in detail in conjunction with the accompanying drawings.

DESCRIPTION OF PREFERRED EMBODIMENTS

In performing the method for fabricating the semiconductor structure and assembly incorporating the present invention, a semiconductor body 11 of a suitable type such as silicon having a surface orientation in the (100) crystal plane. As hereinafter described, the present invention can be practiced either by utilizing a semiconductor body 11 which can be doped throughout with an imputity of one conductivity type such as P-type, and thereafter utilizing a triple diffusion to form active devices such as transistors therein and obtaining the desired isolation between the devices forming the integrated circuit by the use of back biased P-N junctions in a manner well known to those skilled in the art.

Figure 1:
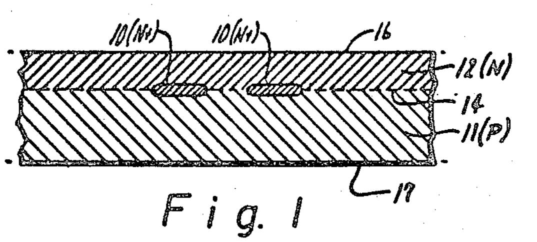
FIGS. 1 – 10 are cross-sectional views showing the steps utilized in constructing the semiconductor structure and assembly incorporating the present invention.

Alternatively, an epitaxial device can be formed by first growing an oxide layer (not shown) as a mask, opening windows (not shown) in the mask and diffusing an N+ impurity therethrough to provide N+ regions 10 which will serve as buried layers in a manner well known to those skilled in the art. An epitaxial layer 12 then can be grown on the doped semiconductor body 11 by suitable epitaxial techniques well known to those skilled in the art. The layers 10 grow into the layer 12 as it is deposited partially by diffusion and partially by outgassing in a manner well known to those skilled in the art. At the time that the layer 12 is being grown, it can also be doped with an impurity and, as shown, can be doped with an impurity of opposite conductivity type, i.e., N-type as shown in FIG. 1 to also provide a P-N junction 14 which extends in a plane which is parallel to the plane of a first major surface 16 and a second major surface 17. As viewed in FIG. 1, the first major surface 16 is the exposed surface of the N-type layer 12, whereas the second major surface 17 is the bottom or back side of the P-type semiconductor body 11. Both the surfaces 16 and 17 are planar and parallel.

Figure 2:
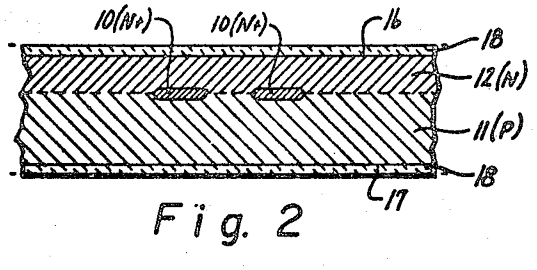

An insulating layer 18 is then formed on the surfaces 16 and 17 by placing the semiconductor structure shown in FIG. 1 in an oxidizing atmosphere so that the insulating layer 18 is formed of silicon dioxide as shown in FIG. 2.

Figure 4:
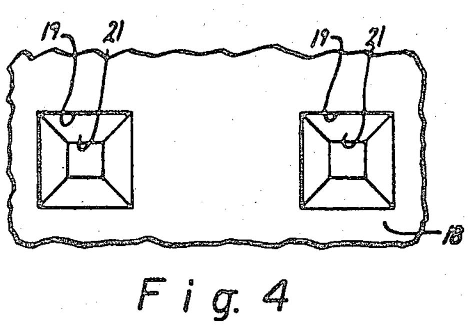

Windows 19 are then formed in the insulating layer 18 which covers the surface 17 by suitable photolithographic tecniques well known to those skilled in the art. The openings formed by the windows 19 can have any suitable geometry. For example, they can be square as shown in FIG. 4 of the drawings or, alternatively, they can be circular or any other desired geometry as hereinafter described depending upon the type of etch which is used. The windows 19 should be positioned in such a manner so that there is sufficient space between the windows to fabricate the devices which are to be utilized in the integrated circuit which is to be formed in the semiconductor body.

Figures 8, 9, 10, 11:
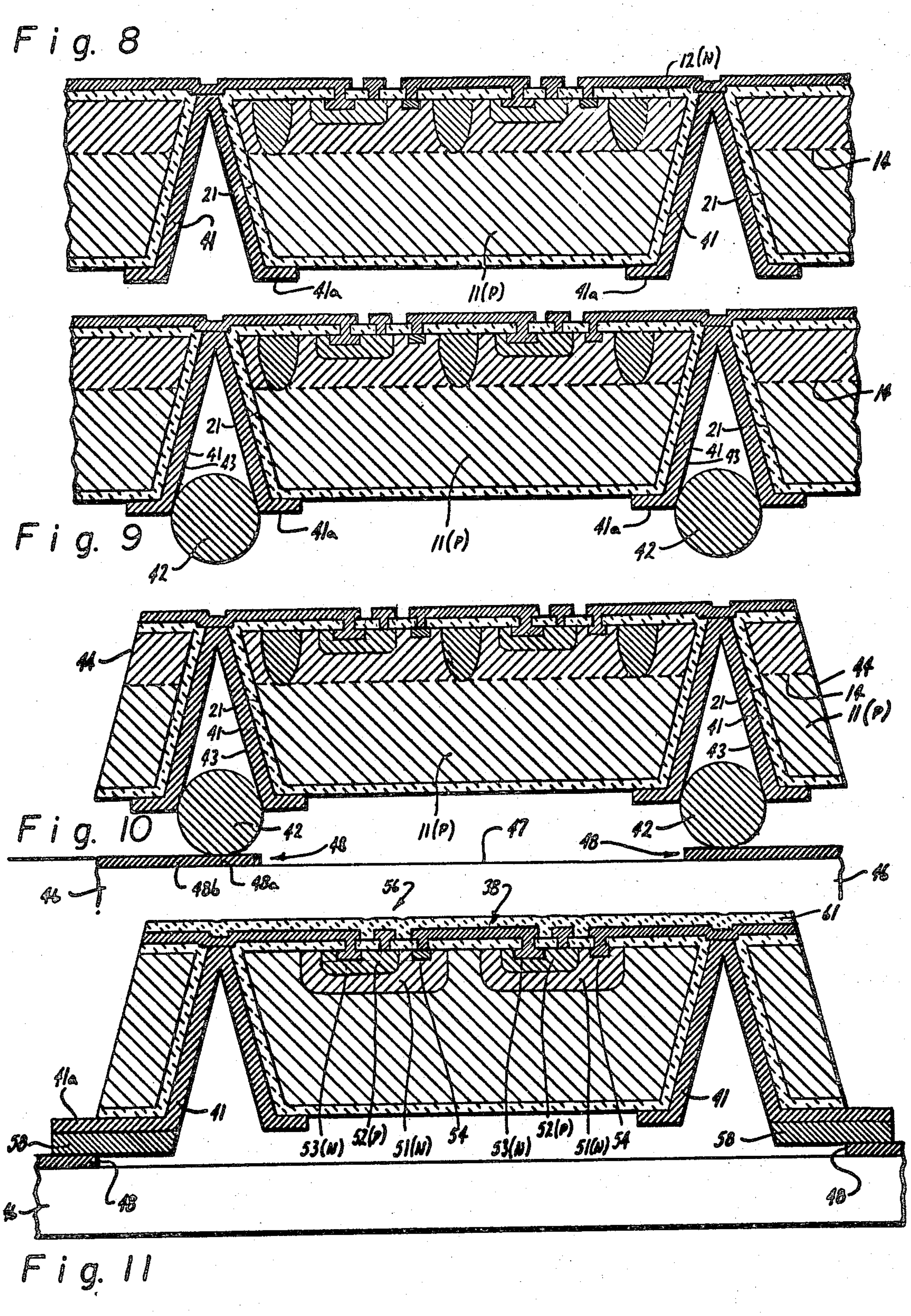
FIG. 11 is a cross-sectional view showing a semiconductor assembly incorporating the present invention in which beam leads have been utilized.

After the windows 19 have been formed in the oxide layer 18, holes 21 are etched all the way through the semiconductor body or wafer 11 as shown in FIG. 11 and which extend between the two surfaces 17 and 16 so that the bottom side of the oxide layer 18 covering the surface 16 is exposed. One etch found to be particularly suitable is an anisotropic etch which, as is well known to those skilled in the art, selectively attacks the silicon wafer to provide pyramidal-shaped holes when square or rectangular geometry is utilized for the windows. It should be appreciated that the size of the windows 19 should be large enough so that the holes 21 will be etched all the way through the semiconductor body 21 without coming to an apex before the oxide layer 18 on the other side is reached. This is true when utilizing (100) oriented material. If this material is not utilized and (111) oriented material is used, it will be necessary to utilize an isotropic etch, in which event the holes 21 will have rounded or dish-shaped sides rather than the straight sides which are obtained when an anisotropic etch is utilized. If circular windows are used with an anisotropic etch, the holes 21 will be in the form of a pyramid whose base is equal to the diameter of th circle.

Figure 3:
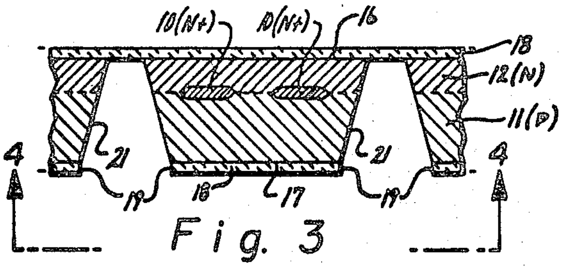
Figure 5:
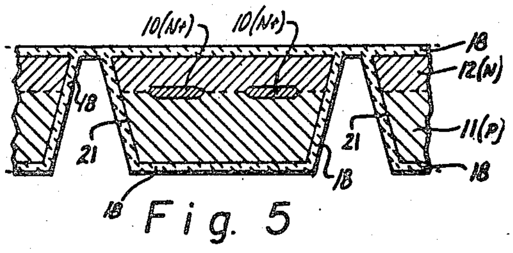
Figure 6:
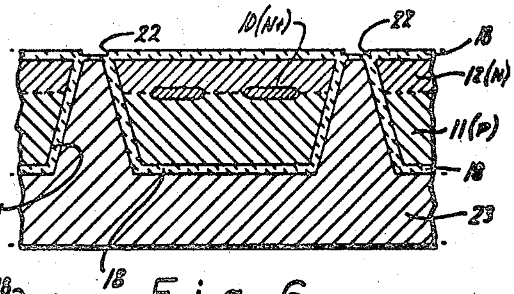

The structure which is shown in FIGS. 3 and 4 is then placed in an oxidizing atmosphere so that an insulating layer in the form of silicon dioxide is grown on the side walls of the body 11 which form the holes 21 so that in effect there is a continuous insulating layer 18 which extends across the surface 17 and into the holes 21 and joins with the insulating layer 18 provided on the surface 16 as shown in FIG. 5. Thereafter, the oxide layer 18 covering the surface 16 is masked by suitable photolithographic techniques and the layer 18 is etched to provide small recesses 22 which overlie the tops of the pyramid-shaped holes 21 as shown in FIG. 6. Thus, the oxide layer 18 overlying the pyramidal-shaped holes 21 is in effect thinned to a thickness of approximately 1000 Angstroms for a purpose hereinafter described.

Prior to the formation of the small recess 22 or thereafter, if desired, a support body 23 is provided for the semiconductor body or wafer 11 and typically consists of polycrystalline silicon which is deposited upon the back side of the wafer 11 to completely cover the oxide layer 18 and to fill in the pyramidal-shaped holes 21 in the manner shown in FIG. 6. As hereinafter explained, it may not be necessary to provide the support body 23 particularly if the semiconductor body or wafer 11 is sufficiently strong even though it has the pyramidal-shaped holes cut into the same.

After these steps have been completed, a plurality of integrated circuits are formed in the wafer or semiconductor body 11, each of which includes at least one semiconductor device. The first step is to provide the necessary isolation between the devices which make up an integrated circuit by forming isolated regions in the semiconductor body. These regions 26 are formed by cutting windows (not shown) in the oxide layer 18 covering the first major surface 16 and thereafter diffusing an impurity of the proper conductivity type as, for example, P-type, to form diffusion posts 27 which extend downwardly into the semiconductor body 11 through the N layer 12 and engage the P-type semiconductor body 11 so that the P-type material in the posts 27 joins with the P-type material of the semiconductor body 11. Thus, it can be seen that the P-type posts 27, in conjunction with the P-type material 11, form isolation regions which define the limits of the isolated N-type regions 26. As can be seen, the N-type regions 26 have surfaces which are common with the major surface 16.

Figure 7:
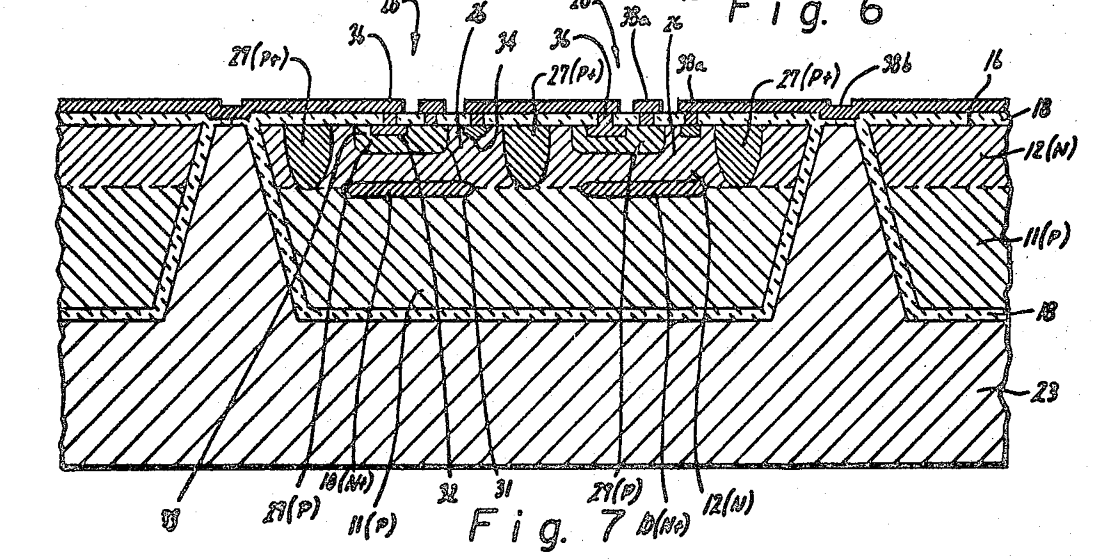

At least one circuit device is formed on each of the regions 26. Thus, there has been formed as shown in FIG. 7, a pair of active semiconductor devices in the form of transistors 28. The transistors 28 are formed in a conventional manner. Thus, for example, windows (not shown) are formed in the oxide layer 18, and thereafter an impurity of the opposite type, i.e., opposite to that of region 26, is diffused through the opening to provide a base region 29 which forms a dish-shaped collector junction 31 that extends to the surface 16. Thereafter, additional windows (not shown) are formed in the oxide layer 18 and an impurity of the type, of which the region 26 is formed, is diffused through the opening to provide a region 32 which serves as the emitter of the transistor and which also forms a P-N junction 33 which extends to the surface 16. At the same time, openings (not shown) are formed in the oxide 18 and the N-type impurities are diffused therethrough to provide N+ regions 34 which are utilized for making contact to the collector region. It should be pointed out that during the various diffusions that are hereinbefore described, the oxide regrows in the windows which have been formed and is sufficiently thick to prevent other material from diffusing therethrough. Therefore, rather than removing the oxide layer 18 and regrowing the same, the same oxide layer can be utilized.

When the diffusion operations have been completed, windows 36 are formed in the oxide layer 18, and thereafter a metallization of a suitable type, such as aluminum, is evaporated onto the exposed surface of the insulating layer 18 and into the windows 36. Thereafter, the undesired portions of the metallization are removed so that there remains a lead structure 38 which has contact portions **38*a* extending through the windows 36 and making contact to the collector, base and emitter regions of the transistors 38 and also to the other elements which make up the integrated circuit. Thus, for example, a typical integrated circuit can include diodes and resistors. The diodes and resistors can be formed at the same time that the transistors are being formed so that the lead structure 38 can be formed to make contact with all of the devices which make up the integrated circuit. The lead structure is adherent to the insulating layer 18 and is also provided with portions which extend away from the devices which make up the integrated circuit and form contact pad portions 38*b* which are formed in the recesses 22** and which generally overlie the tops of the pyramidal-shaped holes 21 as shown particularly in FIG. 7.

After the integrated circuits have been formed in the semiconductor body or wafer 11, the structure which is shown in FIG. 7 is placed in a suitable etch to remove the support body 23 in the form of a polycrystalline silicon to again expose the pyramidal-shaped holes 21 in the bottom side of the semiconductor structure. The semiconductor structure is then placed in another etch which selectively attacks the silicon dioxide insulating layer 18. This etching step is continued until the thinned portions of silicon dioxide underlying the portions **38*b* of the lead structure are removed to expose the underside of the metal portions 38*b*. This latter etching step does not harm the other parts of the semiconductor structure because the other silicon dioxide layer which is exposed is much thicker than the thinned out portions and, therefore, even though certain portions of the layer 18 are removed, the effectiveness of the layer 18** as an insulating layer is not impaired.

Metallization of a suitable type such as aluminum is then deposited on the back side of the semiconductor structure in a suitable manner such as by evaporation. This metallization enters the pyramidal-shaped holes 21 and makes contact with the under sides of the portions **38*b* of the lead structure 38 as shown particularly in FIG. 8. Thereafter, the undesired metal is removed by a suitable etch so that all that remains is metallization which forms conducting means 41 that covers the insulating layer 18 covering the walls which form the pyramidal-shaped holes 21 so that the metallization itself forms a pyramid-like structure. The metallization which forms the conducting means 41 is provided with portions 41*a* which are disposed on the insulating layer 18 overlying the surface 17** and which lie in a common plane.

At this point, means is provided which facilitates making contact to the conducting means 41. Such means can take a number of forms. For example, as shown in FIG. 9, a plurality of metal balls or ball-like members 42 formed of a suitable conducting material such as aluminum are placed in the pyramidal-shaped recesses 43 within the metallization which forms the conducting means 41. It will be noted that the balls 42 have a diameter such that a substantial portion of the ball can fit within the recesses 43 and below the surface of the oxide layer 18.

The balls 42 can be placed in the grooves in any suitable manner. For example, the semiconductor wafer 11 can be placed in a dish and a quantity of the aluminum balls 42 placed in the dish and the balls rolled over the wafer which has been turned upside down to expose the recesses 43 until one ball 42 has rolled into each of the recesses. The excess balls are then rolled off the surface of the wafer. At this time, all the balls 42 are engaged by a plate (not shown) or other suitable instrument to apply some pressures to the balls 42 and to make thermocompression bonds between the balls 42 with the metallization forming the conducting means 41. However, care should be taken that too much pressure is not applied to the balls to squash them flat with the surface. It is important that portions of the balls 42 extend above the oxide layer 18 to facilitate later interconnections as hereinafter described.

As soon as these steps have been completed, the semiconductor structure is ready to be bonded to means which permits connections to be made to the outside world. Typically, such means can consist of a substrate 46 which can be formed of any suitable insulating material such as glass or ceramic. The substrate 46 is provided with a planar surface 47 upon which there is formed a lead structure 48. Typically, the lead structure can be formed on the surface 47 by metallizing the entire top surface and then removing the undesired portions by etching so that there remains the desired lead structure. As can be seen from FIG. 10, the lead structure 48 is provided with portions **48*a* which have the same arrangement and spacing as the balls 42 provided in the semiconductor structure. The lead structure 48 is also provided with portions 48*b* which extend out from beneath the semiconductor body or wafer 11 and are connected to contact pads (not shown) also forming a part of the lead structure and which can be utilized for making connections to the outside world. The balls 42 are secured to the contact portions 48 in a suitable manner such as by thermocompression bonds. Such bonds can be obtained by applying pressure to the semiconductor body relative to the substrate 46**. In addition, to facilitate the formation of the thermocompression bond, heat can be utilized.

Alternatively, if desired, the substrate 46 with the lead structure 48 carried thereby can be utilized for pressing the balls 42 into the recesses 43 and forming thermocompression bonds between the balls 42 and the conducting means 41, and at the same time thermocompression bonds are formed between the balls 42 and the lead structure 48.

After the balls 42 have been placed in the recesses 43, the semiconductor wafer can be scribed in a conventional manner and then broken to provide individual chips or dies. Alternatively, the semiconductor body or wafer 11 is waxed to a holder and then the top surface is masked in a suitable manner and an etch is utilized to separate the integrated circuits. When an anisotropic etch is utilized, the side margins of the semiconductor structure will have inclined side walls 44 as shown in FIG. 10.

As pointed out previously, if the semiconductor body has sufficient rigidity after the pyramidal-shaped holes 21 have been formed therein, the formation of a support body or handle 23 can be eliminated.

Also, it should be pointed out that in the embodiment of the method hereinbefore described, the pyramidal-shaped holes 21 were formed in the semiconductor body 11 prior to the formation of the devices in the semiconductor body which make up the integrated circuit. It is very possible and it may be desirable in certain circumstances to first form the devices which make up the integrated circuits in the desired areas on the semiconductor body and thereafter forming the pyramidal-shaped holes 21 in the body. In such an event, the oxide layer 18 would again be thinned out in the regions where the pyramidal-shaped holes are to be formed in the body so that the thinned-out portion of the silicon dioxide can be readily etched away to expose the lead structure 38 so that thereafter the same steps as hereinbefore described can be followed.

It should be appreciated that other types of construction can be utilized in place of the balls 42 for making contact between the conductive or conducting means 41 and the lead structure 48 carried by the substrate 46. Thus, for example, pillars could be formed which could be placed in the recesses 43. Similarly, a beam lead construction could be provided as shown in FIG.

11. As also shown in FIG. 11, triple diffused transistors can be utilized. The triple diffused devices would be formed in a conventional manner. Thus, as shown, there are provided collector, base and emitter regions 51, 52 and 53 which form P-N junctions which extend to the surface to provide transistors 56. Regions 54 provided for making contact to the collector region 51 can be formed at the same time that the emitter region 53 is being formed. The conductivities of the regions can be such that either NPN or PNP transistors are formed. The metallization 38 for making contact to the transistors 56 can be very similar to that hereinbefore described. Similarly, the pyramidal-shaped holes 21 can be formed in the same manner as can be the conducting means 41 disposed within the holes. The conducting means 41 differs, however, slightly in that the portions 41a are extended in one direction so they extend substantially beyond the portions of the semiconductor body 11 which is to remain and to extend a distance which is as far as it is desired to have the beam leads extend. Thereafter, the portions 41a of the conducting means 41 are reinforced or thickened by electroplating additional metal on the exposed side of the portions 41a to provide relatively rigid beam leads 58. After the beam leads 58 have been formed, the wafer 11 can be separated by waxing the wafer 11 to a holder and then masking the top surface and etching away the semiconductor body 11 until the underside surface of the conducting means *41a* is exposed as shown in FIG. 10.

After separation has been accomplished, the semiconductor structure can be bonded directly to the substrate 46 carrying the lead structure 48 with the outer extremities of the beam leads 58 in engagement with the lead structure 48. Thereafter, a bond can be formed between the beam leads 58 and the lead structure 48 by the use of thermocompression as hereinbefore described. However, in this case, the pressure may be applied directly to the top side of the beams 58 so that they can be forced into direct contact with the lead structure 48 carried by the substrate 46.

It can be seen from the construction hereinbefore described that there has been provided semiconductor structures which, when mounted upon substrates, form semiconductor assemblies. In these semiconductor assemblies, the devices which make up the integrated circuits in the semiconductor structure can still be viewed from the top side since the bonds to the devices have been made from the back side of the semiconductor structure. In view of the fact that the contacts for the devices come out through the back side of the semiconductor body, it is very easy to apply a continuous, uninterrupted protective coating to the top surface of the semiconductor structure after the bonding operations have been completed to completely seal the same. Thus, as shown in FIG. 11, there can be provided a protective layer 61 which covers the entire top surface of the semiconductor structure without any leads extending therethrough. Thus, typically, a passivating oxide, nitride or other passivating material can be applied to the surface to completely seal the same. This can be accomplished with very little difficulty because it is unnecessary to bring out leads through the passivating material. A similar passivating layer 61 has been provided on the assembly which is shown in FIG. 10.

It is apparent from the foregoing that there has been provided a semiconductor structure, assembly and method which has many distinct advantages. In particular, it permits viewing of the integrated circuits because contact is made from the back side of the semiconductor body carrying the integrated circuit. In addition, with the present method, it is relatively easy to obtain the proper alignment between the conductive means and the lead structure carried by the substrate in which the semiconductor structure is to be mounted. The semiconductor structure and assembly is also advantageous in that various types of mountings can be utilized as, for example, balls, pillars, beam leads and the like. The method is also advantageous in that the steps required for making the same are compatible with present day techniques for making integrated circuits.

I claim:

1. In a semiconductor assembly, a semiconductor body having first and second major surfaces, a plurality of semiconductor devices formed in said body exclusively adjacent the first major surface and having areas with impurities therein extending exclusively to said first major surface, a layer of insulating material overlying said first and second major surfaces, a lead structure carried by said layer of insulating material on said first major surface and having contact portions extending through said layer of insulating material on said first major surface and making contact with said areas of said devices, said lead structure having portions spaced laterally away from said devices, metallic conductive means extending through said semiconductor body between said first and second major surfaces and making contact with said portions of the lead structure spaced laterally away from the devices whereby said conducting means provides the sole means for making contact to the devices carried by the semiconductor body, a substrate formed of an insulating material, a metallic lead structure adherent to the substrate and having portions arranged in a predetermined pattern on the substrate, and contact means forming electrical and physical contact between said portions carried by the substrate and said metallic conductive means carried by the semiconductor body with the semiconductor devices facing away from the substrate whereby contact to the devices carried by the semiconductor body is made exclusively through the lead structure carried by the substrate, said contact means forming said semiconductor body and said substrate into a unitary assembly.

2. An assembly as in claim 1 wherein said contact means forming electrical and physical contact between the portions of the structure carried by the substrate and said conducting means carried by the semiconductor body is of a size so as to space the semiconductor body a substantial distance above the substrate so that there is no contact between said semiconductor body and the substrate except through said contact means.

3. An assembly as in claim 2 wherein said metallic conductive means includes portions formed integral therewith and carried by said layer of insulating material on said second major surface and wherein said means forming electrical and physical contact between the portions of the lead structure carried by the substrate and the conductive means carried by the semiconductor body is in the form of reinforced beam leads secured to said portions of said conductive means on said second major surface and with the portions of the lead structure carried by the substrate.

4. An assembly as in claim 1 wherein said substrate extends outwardly from the semiconductor body so that the metallic lead structure carried by the substrate can be contacted to form electrical connections to the devices carried by the semiconductor body.

5. An assembly as in claim 1 wherein said semiconductor body is formed of 100 oriented material and wherein said metallic conductive means follows the crystal orientation of the semiconductor body together with a layer of insulating material extending through said semiconductor body between said first and second major surfaces and carrying said metallic conductive means to insulate said metallic conductive means from the semiconductor body.

6. An assembly as in claim 1 wherein said devices are isolated from each other by diffusion isolation.

7. An assembly as in claim 1 wherein the device can be viewed from the top side together with a continuous, uninterrupted layer of protective material overlying the semiconductor devices formed in the semiconductor body.

* * * * *